United States Patent
Inoue et al.

(10) Patent No.: US 9,102,850 B2
(45) Date of Patent: Aug. 11, 2015

(54) PREPREG, METAL-CLAD LAMINATE, AND PRINTED WIRING BOARD

(71) Applicant: PANASONIC CORPORATION, Osaka (JP)

(72) Inventors: Hiroharu Inoue, Osaka (JP); Koji Kishino, Fukushima (JP); Takashi Hoshi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/389,525

(22) PCT Filed: Mar. 11, 2014

(86) PCT No.: PCT/JP2014/001361
§ 371 (c)(1),
(2) Date: Sep. 30, 2014

(87) PCT Pub. No.: WO2014/141689
PCT Pub. Date: Sep. 18, 2014

(65) Prior Publication Data
US 2015/0075852 A1    Mar. 19, 2015

(30) Foreign Application Priority Data
Mar. 13, 2013   (JP) .................. 2013-050588

(51) Int. Cl.
| | | |
|---|---|---|
| C09D 163/04 | (2006.01) | |
| H05K 1/02 | (2006.01) | |
| H05K 1/05 | (2006.01) | |
| C08J 5/24 | (2006.01) | |
| H05K 1/03 | (2006.01) | |
| C09D 163/00 | (2006.01) | |

(52) U.S. Cl.
CPC .................. *C09D 163/04* (2013.01); *C08J 5/24* (2013.01); *C09D 163/00* (2013.01); *H05K 1/0271* (2013.01); *H05K 1/0366* (2013.01); *H05K 1/0373* (2013.01); *H05K 1/056* (2013.01); *H05K 2201/0209* (2013.01); *H05K 2201/0239* (2013.01); *Y10T 428/249921* (2015.04); *Y10T 442/20* (2015.04)

(58) Field of Classification Search
CPC .. C09D 163/04; C09D 163/00; H05K 1/0366; H05K 1/056; H05K 1/0271; H05K 1/0373; H05K 2201/0209; H05K 2201/0239; C08J 5/24; Y10T 442/20; Y10T 428/249921
USPC .............................. 174/255, 256, 258; 442/59
See application file for complete search history.

(56) References Cited

U.S. PATENT DOCUMENTS

2011/0061567 A1 * 3/2011 Iji et al. .................... 106/170.58

FOREIGN PATENT DOCUMENTS

| | | | |
|---|---|---|---|
| JP | 05-320481 | A | 12/1993 |
| JP | 2006-137942 | A | 6/2006 |
| JP | 2006137942 | A * | 6/2006 |
| JP | 2007-138152 | A | 6/2007 |
| JP | 2008-007756 | A | 1/2008 |
| JP | 2008007756 | A * | 1/2008 |
| JP | 2011-088950 | A | 5/2011 |
| WO | 2009/139463 | A1 | 11/2009 |

OTHER PUBLICATIONS

International Search Report issued in International Application No. PCT/JP2014/001361 with Date of mailing Jun. 17, 2014.

* cited by examiner

Primary Examiner — Timothy Thompson
Assistant Examiner — Amol Patel
(74) Attorney, Agent, or Firm — McDermott Will & Emery LLP

(57) ABSTRACT

The prepreg in accordance with the present invention is formed from a resin composition and a fabric substrate impregnated with the resin composition. The resin composition contains: (A) a thermosetting resin composition; (B) a resin having a Tg not more than 100° C.; and (C) an inorganic filler. The resin (B) having the Tg not more than 100° C. has: a carbonyl group or a siloxane group; and an epoxy group or a phenolic hydroxyl group. The inorganic filler (C) is subjected to surface-treatment with a silane coupling agent represented by a general formula: $YSiX_3$, wherein X represents a methoxy group or an ethoxy group, and Y represents an aliphatic alkyl group having 6 to 18 carbon atoms.

8 Claims, No Drawings

PREPREG, METAL-CLAD LAMINATE, AND PRINTED WIRING BOARD

CROSS REFERENCE TO RELATED APPLICATIONS

This application is a U.S. national phase application of PCT International Patent Application Number PCT/JP2014/001361 filed on Mar. 11, 2014, claiming the benefit of priority of Japanese Patent Application Number 2013-050588, filed Mar. 13, 2013, the entire contents of which are incorporated by reference.

TECHNICAL FIELD

The present invention relates to a prepreg, a metal-clad laminate formed of the prepreg, and a printed wiring board formed of the metal-clad laminate.

BACKGROUND ART

In the past, a prepreg has been formed by impregnating a fabric substrate with a resin composition containing a thermosetting resin and drying thus-obtained substrate by application of heat until the resin composition is in a semi-cured state (see, Patent Literatures 1 to 3, for example). Besides, a metal-clad laminate is formed by disposing metal foil on the prepreg formed in the aforementioned manner, and a printed wiring board is formed by patterning the metal-clad laminate to make a patterned conductor. Thereafter, a package (PKG) is prepared by mounting a semiconductor element on the printed wiring board and enclosing the element. To impart excellent quality to such a package, a multilayer substrate with high reliability such as connection reliability in which warpage and the like is suppressed has been required.

One approach to improve connection reliability of a multilayer substrate is to reduce a coefficient of thermal expansion (CTE) of a substrate material. When a difference in CTE between the resin composition in the multilayer substrate and patterned Cu or plating in a through-hole is decreased, stress caused by thermal expansion or thermal contraction in a connection reliability test (e.g., thermal shock test) can be reduced. Accordingly, the connection reliability can be improved. Specifically, the approach may be to add an inorganic filler into the resin composition with which the substrate is to be impregnated.

Another approach to improve the connection reliability is to reduce elasticity of the substrate material. In the approach, it is planned that the connection reliability is improved through a principle in which a low elastic material (resin) buffers the stress caused by thermal expansion or thermal contraction in the connection reliability test (e.g., thermal shock test). Specifically, this approach may be to appropriately select resins to be contained in the resin composition with which the substrate is to be impregnated to make the resin composition lower in elasticity, or to reduce an amount of the inorganic filler added into the resin composition.

CITATION LIST

Patent Literature

Patent Literature 1: JP 2006-137942 A
Patent Literature 2: JP 2007-138152 A
Patent Literature 3: JP 2008-007756 A

SUMMARY OF INVENTION

Technical Problem

To obtain the multilayer substrate with higher connection reliability in which warpage is less likely to occur, it is effective to reduce the CTE or elasticity of the substrate material. However, there is possibility that warpage occurs in such a substrate material. Therefore, the substrate material is not sufficient in performance.

Vigorous study in view of the above insufficiency taught that occurrence of the warpage was more suppressed when a prepreg which has a low elastic modulus yet has high elongation characteristics was used as the substrate material. Accordingly, the present invention is aimed to provide a prepreg which is low in elasticity and has high elongation characteristics, and also to provide a metal-clad laminate formed of the prepreg and a printed wiring board formed of the metal-clad laminate.

Solution to Problem

The prepreg in accordance with the present invention is formed from a resin composition and a fabric substrate impregnated with the resin composition. The resin composition contains: (A) a thermosetting resin composition; (B) a resin having a Tg not more than 100° C.; and (C) an inorganic filler. The resin (B) having the Tg not more than 100° C. has: a carbonyl group or a siloxane group; and an epoxy group or a phenolic hydroxyl group. The inorganic filler (C) is subjected to surface-treatment with a silane coupling agent represented by a following general formula (1).

$$YSiX_3 \qquad (1)$$

(in the formula (1), X represents a methoxy group or an ethoxy group, and Y represents an aliphatic alkyl group having 6 to 18 carbon atoms.)

In the prepreg, the resin (B) having the Tg not more than 100° C. preferably has a weight average molecular weight falling within a range of 10,000 to 1,000,000.

In the prepreg, the resin (B) having the Tg not more than 100° C. preferably has repeating units represented by following formulae (I) and (II), respectively, and an epoxy group, in molecule.

[Chemical formula 1]

(in the formulae (I) and (II), R1 represents H or CH$_3$, and R2 represents H or an alkyl group, and a ratio of x:y is 0:1 to 0.35:0.65.)

In the prepreg, the resin (B) having the Tg not more than 100° C. preferably has a siloxane group and a phenolic hydroxyl group.

In the prepreg, a tensile elongation percentage of the fabric substrate in an oblique direction at 45 degrees is preferably 5% or more when the resin composition with which the fabric substrate is impregnated is in a fully-cured state.

In the prepreg, a peak position of a loss tangent determined by dynamic mechanical analysis is preferably at a temperature of 150° C. or more, when the resin composition with which the fabric substrate is impregnated is in a fully-cured state.

A metal-clad laminate in accordance with the present invention includes the prepreg and metal foil on the prepreg.

A printed wiring board in accordance with the present invention includes the metal-clad laminate formed to have a patterned conductor.

Advantageous Effects of Invention

The prepreg in accordance with the present invention is formed from a resin composition containing (A) a thermosetting resin composition, (B) a resin having a Tg not more than 100° C., and (C) an inorganic filler having been subjected to a particular surface treatment. Therefore, the prepreg is low in elasticity but has high elongation characteristics. Hence, a package made from a substrate material composed of the prepreg has a property in which warpage is suppressed and high connection reliability.

DESCRIPTION OF EMBODIMENTS

Embodiments of the present invention will be described below.

A prepreg in accordance with the present invention is formed from a resin composition and a fabric substrate impregnated with the resin composition. For example, the prepreg may be formed by impregnating a fabric substrate with a resin composition, and drying the fabric substrate impregnated with the resin composition by application of heat until the resin composition is in a semi-cured state (i.e., a B-stage state).

In the prepreg, the resin composition contains at least (A) a thermosetting resin composition, (B) a resin having a Tg not more than 100° C., and (C) an inorganic filler (hereinafter, they may be referred to as an A-component, a B-component, and a C-component, respectively).

The thermosetting resin composition which is the A-component contains at least a thermosetting resin, and may further contain other additives such as a curing agent as requested.

The thermosetting resin is not particularly limited so long as it is a known thermosetting resin. Examples of the thermosetting resin include epoxy resin, phenolic resin, imide resin, cyanate ester resin, vinyl ester resin, urea resin, diallyl phthalate resin, melanin resin, guanamine resin, unsaturated polyester resin, and a melamine-urea co-condensation resin. These resins may be used alone or in combination. Particularly, out of these thermosetting resins, epoxy resin, phenolic resin, imide resin, cyanate ester resin, and vinyl ester resin are preferable. In this case, a prepreg having a low elastic modulus and high elongation characteristics can be easily formed.

The above-mentioned epoxy resin is not particularly limited so long as it is an epoxy resin to form various substrates usable in preparation for a laminate or a circuit substrate. Specifically, as the epoxy resin, one or two of naphthalene epoxy resin, cresol novolac epoxy resin, bisphenol A epoxy resin, bisphenol F epoxy resin, bisphenol S epoxy resin, phenol novolac epoxy resin, alkyl phenol novolac epoxy resin, aralkyl epoxy resin, biphenol epoxy resin, dicyclopentadiene epoxy resin, an epoxidized compound of a condensation product between one of phenols and an aromatic aldehyde having a phenolic hydroxyl group, triglycidyl isocyanurate, alicyclic epoxy resin, and the like may be used, but the epoxy resin is not limited thereto.

Examples of the above-mentioned phenolic resin include phenol novolac epoxy resin, cresol novolac resin, aromatic hydrocarbon formaldehyde resin-modified phenolic resin, dicyclopentadiene-phenol addition type resin, phenol aralkyl resin, cresol aralkyl resin, naphthol aralkyl resin, biphenyl-modified phenol aralkyl resin, phenoltrimethylolmethane resin, tetraphenylolethane resin, naphthol novolac resin, naphthol-phenol co-condensed novolac resin, naphthol-cresol co-condensed novolac resin, biphenyl-modified phenolic resin, and aminotriazine-modified phenolic resin. These resins may be used alone or in combination.

The above-mentioned imide resin may be polyamide-imide resin, polymaleimide resin, or the like. Specific examples of the imide resin include N,N-ethylenebismaleimide, N,N-hexamethylenebismaleimide, N,N-methaphenylenebismaleimide, N,N-paraphenylenebismaleimide, N,N-4,4-diphenylmethanebismaleimide, N,N-4,4-diphenyletherbismaleimide, N,N-4,4-diphenylsulfonebismaleimide, N,N-4,4-dicyclohexylmethanebismaleimide, N,N-α,α-4,4-dimethylenecyclohexanebismaleimide, N,N-4,4-metaxylylene bismaleimide, and N,N-4,4-diphenylcyclohexanebismaleimide.

Examples of the above-mentioned cyanate ester resin include bis(4-cyanatophenyl)ethane, 2,2-bis(4-cyanatophenyl)propane, 2,2-bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, and cyanate-esterified compound of phenol added dicyclopentadiene polymer.

The above-mentioned vinyl ester resin is not particularly limited so long as it has thermosetting properties. The vinyl ester resin may be: a resin obtained by reacting a known epoxy resin with unsaturated monobasic acid such as acrylic acid and methacrylic acid; or a resin obtained by reacting saturated polyester or unsaturated polyester having a carboxyl group at its terminal with an epoxy compound containing α,β-unsaturated carboxylic acid ester group, the saturated polyester or unsaturated polyester being obtained by reacting saturated dicarboxylic acid and/or unsaturated dicarboxylic acid with polyvalent alcohol.

The above-mentioned curing agent is not particularly limited, but may be a known curing agent. Examples of the curing agent include dicyandiamide, a phenolic curing agent, an acid anhydride curing agent, an amino triazine novolac based curing agent, and cyanate resin. Particularly when the thermosetting resin is an epoxy resin, a phenolic curing agent such as novolac-type phenolic curing agent (a phenolic curing agent having a novolac skeleton) and a naphthalene-type phenolic curing agent (a phenolic curing agent having a naphthalene skeleton) is preferably used. When the thermosetting resin is a cyanate ester resin, a curing agent which is a metal-based reaction catalyst may be used. When the thermosetting resin is an imide resin, a curing agent (cross-linker) which is polyamine may be used.

Note that the A-component may contain a solvent as requested.

The B-component is a resin (hereinafter, may be referred to as B-component resin) which has a glass transition temperature (Tg) not more than 100° C. and has either a carbonyl group or siloxane group and either an epoxy group or a phenolic hydroxyl group, as functional groups in molecule. In other words, the B-component resin has the Tg of 100° C. or less, and is any one of: a resin having a carbonyl group and an epoxy group; a resin having a carbonyl group and a phenolic hydroxyl group; a resin having a siloxane group and an epoxy group; and a resin having a siloxane group and a phenolic hydroxyl group. The siloxane group is a group having a siloxane bond (Si—O—Si). Of course, any four types of the B-component resins may have another functional group.

When the Tg of the B-component resin is not more than 100° C., the resultant prepreg can be easily adjusted to be low in elasticity and can be likely to have good elongation characteristics. The upper limit of the Tg is preferably 80° C., and more preferably is 70° C. The lower limit of the Tg is not particularly limited. Note that the Tg is a value of the resin alone measured by differential scanning calorimetry (DSC).

The B-component resin is preferably a resin having both functional groups of a carbonyl group and an epoxy group in molecule. Specifically, the B-component resin preferably has repeating units represented by the formulae (I) and (II) (see, the above [Chemical formula 1]) in molecule, and further has an epoxy group. The repeating units represented by the above formulae (I) and (II) may compose a main chain of a molecule composing the B-component resin, for example. The epoxy group may be bonded to the main chain, to a side chain thereof, or to a terminal of the main chain.

Besides, in the repeating units represented by the formulae (I) and (II), a ratio of x to y ranges from 0:1 to 0.35:0.65. This means that the B-component resin may not contain the repeating unit represented by the formula (I). When the B-component resin contains both of the repeating units represented by the formulae (I) and (II), the sequence thereof is not particularly limited. In addition, the B-component resin may have different types of the repeating unit represented by the formula (II) (e.g., different types in R2 of the repeating unit). When R2 is an alkyl group in the repeating unit represented by the formula (II), the number of carbon atoms in the alkyl group is not particularly limited, but may be one or more, and may be six or less. This alkyl group may be linear or may be branched. Specific examples of the B-component resin with the above-mentioned constitution include an epoxy-modified acrylic resin (acrylic resin having an epoxy group) and the like.

When the B-component resin has the repeating units represented by the formulae (I) and (II) (see, the above [Chemical formula 1]) and an epoxy group, the elasticity of the resultant prepreg can be easily adjusted, and the prepreg with low elastic modulus can be easily formed. Besides, in this case, the tensile elongation percentage thereof is high, and therefore the resultant prepreg can be excellent in elongation characteristics.

Alternatively, the B-component resin preferably has a siloxane group and a phenolic hydroxyl group. In this case, the elasticity of the resultant prepreg can be further reduced. Specifically, the B-component resin preferably has both of repeating units represented by formulae (III) and (IV) (see, [Chemical formula 2] below), in molecule. The repeating units represented by the formulae (III) and (IV) may compose a main chain of a molecule composing the B-component resin. When the B-component resin has the repeating units represented by the formulae (III) and (IV) in the main chain, the sequence of these two types of repeating units is not particularly limited.

[Chemical formula 2]

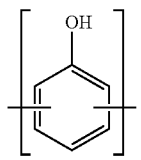
(III)

-continued

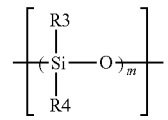
(IV)

In the above formula (IV), R3 and R4 independently represent H or a hydrocarbon group containing 1 to 6 carbon atoms, and m represents an integer of 1 or more.

Specific examples of such a resin include a siloxane-modified phenolic resin, namely, a phenolic resin having a siloxane bond.

When the B-component resin is the resin having a siloxane group and a phenolic hydroxyl group, adjustment to the elasticity of the prepreg can be facilitated. Hence, the prepreg having a low elastic modulus yet having excellent elongation characteristics can be easily formed.

The B-component resin preferably has a molecular average weight (Mw) ranging from 10,000 to 1,000,000. When the lower limit of the molecular average weight is 10,000, the resultant prepreg and metal-clad laminate has good resistance to chemicals. When the upper limit of the molecular average weight is 1,000,000, formation of the prepreg with excellent formability can be facilitated. The molecular average weight more preferably ranges from 200,000 to 900,000. The molecular average weight is a value in terms of polystyrene measured by gel permeation chromatography.

Types of the inorganic filler which is the C-component are not particularly limited. Examples of the inorganic filler include spherical silica, barium sulfate, silicon oxide powder, crushed silica, calcined talc, barium titanate, titanic oxide, clay, alumina, mica, boehmite, zinc borate, zinc stannate, other metal oxide and metal hydrate. The particle diameter and shape of the inorganic filler are not particularly limited, and the inorganic filler may be available inorganic filler.

The inorganic filler has been subjected to surface-treatment with a silane-coupling agent represented by the general formula (1).

$$YSiX_3 \qquad (1)$$

In the formula (1), X represents a methoxy group or an ethoxy group, and Y represents an aliphatic alkyl group containing 6 to 18 carbon atoms. In short, the silane-coupling agent represented by the general formula (1) is a trifunctional alkoxy silane in which aliphatic alkyl groups having a predetermined number of carbon atoms are bonded to a silicon atom.

When the inorganic filler is subjected to surface treatment with the above silane coupling agent, on the surface of the inorganic filler having been subjected to the surface treatment, the aliphatic alkyl groups having the predetermined number of carbon atoms are present. The aliphatic alkyl groups present on the surface of the inorganic filler has a function of relaxing stress which is generated in thermal expansion or thermal contraction of the prepreg. In other words, on the surface of the inorganic filler, a stress relaxation layer composed of the aliphatic alkyl groups is provided. The inorganic filler having such a stress relaxation layer is present in a resin matrix, and therefore the stress relaxation layer can show an effect of relaxation stress caused by thermal expansion or thermal contraction. As a result, the prepreg containing the inorganic filler is less likely to be deformed by heat. There may be some reasons why the stress relaxation effect is shown due to the aliphatic alkyl groups present on the surface of the inorganic filler. One of the reasons may be because there is hydrophobic interaction between the aliphatic alkyl groups and therefore the stress relaxation effect may be shown.

Accordingly, when the prepreg is formed of the resin composition containing the inorganic filler of which the surface is treated with the above-mentioned silane coupling agent, the resultant prepreg is low in elasticity yet has high elongation characteristics. Normally, when the inorganic filler is added, a low CTE can be provided but elasticity is increased, and therefore elongation decreases, unfortunately. In contrast, the above-mentioned inorganic filler has the stress relaxation layer composed of the aliphatic alkyl groups derived from the silane coupling agent, and therefore the resultant prepreg has the low CTE yet is low in elasticity, and further has high elongation characteristics.

The number of carbon atoms in the aliphatic alkyl group (Y) in the above formula (1) preferably falls within a range of 6 to 18. In this case, the above-mentioned effect of the inorganic filler is further enhanced. When the number of carbon atoms in the aliphatic alkyl group (Y) is 5 or less, elasticity of the resin composition is likely to increase, and the prepreg with low elasticity is less likely to be obtained.

The method of the surface-treatment for the inorganic filler with the silane-coupling agent may be a conventional method such as direct treatment, an integral blend method, and a dry concentration method. For the surface-treatment for the inorganic filler with the silane coupling agent, an addition amount of the silane coupling agent based on the inorganic filler is not particularly limited. An amount of the silane coupling agent required to form a monolayer of the silane coupling agent on an entire surface of the inorganic filler is calculated by the following equation (2). A preferable addition amount of the silane coupling agent is 0.1 to 15 times as much as the calculated value.

$$W_c = W_F * S_F / S_c \qquad (2)$$

$W_c$: Amount of the silane coupling agent required to form a monolayer (g)
$W_F$: Addition amount of the inorganic filler (g)
$S_F$: Specific surface area of the inorganic filler (m$^2$/g)
$S_c$: Minimum coverage area by the silane coupling agent (m$^2$/g)

In this case, the stress relaxation effect can be effectively shown.

The resin composition can be prepared by preparing the A-component, the B-component, and the C-component, individually, and compounding them. For the preparation of the resin composition, varnish of the resin composition may be prepared by compounding a solvent for dilution in addition to the A-component, the B-component, and the C-component. Examples of the solvent include ketone-type solvents such as acetone, methyl ethyl ketone, and cyclohexanone, aromatic type solvents such as toluene and xylene, and nitrogen-containing solvents such as dimethylformamide.

Note that, the resin composition may contain other components than the solvent for dilution, such as a curing accelerator (e.g., imidazole), light stabilizer, a viscosity modifier, and a flame retardant.

For preparation of the resin composition, compounding ratios of the A-component, the B-component, and the C-component can be appropriately adjusted. For example, the A-component, the B-component, and the C-component may be compounded so that the thermosetting resin of the A-component is contained in a range of 10 to 40 mass %, the B-component is contained in a range of 5 to 40 mass %, and the C component is contained in a range of 20 to 80 mass %, each based on the total mass of the resin composition (not containing the solvent for dilution and the other components).

The fabric substrate is not particularly limited, but may be a substrate in which a warp thread and a weft thread are woven so as to be almost perpendicular to each other, like a plain-woven fabric and the like. For example, the fabric substrate may be a fabric made of inorganic fibers such as glass cloth or a fabric made of organic fibers such as aramid cloth and polyester cloth. Alternatively, the fabric substrate may be a non-woven fabric made of inorganic fiber or organic fiber. The fabric substrate preferably has a thickness ranging from 10 to 200 μm.

The prepreg may be formed by impregnating the fabric substrate with the resin composition containing the above-mentioned A-component, B-component, and C-component, and drying the resultant substrate by application of heat until the resin composition is in a semi-cured state (B-stage state). The temperature condition and time to make the resin composition be in the semi-cured state may fall in a range of 120 to 190° C. and in a range of 3 to 15 min, respectively, for example.

The prepreg is made of the resin composition containing the A-component, the B-component, and the C-component as essential components. Accordingly, the prepreg is provided with stiffness owing to the thermosetting resin of the A-component, yet the prepreg is adjusted so as to be low in elasticity by the B-component resin. Besides, since stress caused by thermal expansion or thermal contraction is relaxed by the inorganic filler of the C-component, the CTE (coefficient of thermal expansion of the substrate material) can be decreased. Particularly, since the inorganic filler of the C-component has the stress relaxation layer prepared by the particular surface-treatment, an increase in elasticity caused by addition of the inorganic filler can be likely to be suppressed, and therefore the prepreg can show high elongation characteristics.

Therefore, the substrate material prepared from the prepreg can show both of a low elasticity characteristic and a high elongation characteristic, and therefore warpage in the substrate material is less likely to occur. Accordingly, it is possible to improve connection reliability of the substrate material compared with a conventional substrate material. The reason why the warpage is less likely to occur may be because the substrate material is low in elasticity and can be highly elongated (that is, deformable), and therefore can easily follow change in a shape of a semiconductor chip.

The prepreg preferably has a measured value of an elastic modulus referred in the following Examples not greater than 5 GPa, so that the prepreg has the characteristic of a low elastic modulus.

Besides, the prepreg in accordance with the present invention obtained in the above-mentioned manner is further heated so that the resin composition is in a fully-cured state. The prepreg preferably has a tensile elongation percentage along an oblique direction at 45 degrees to a warp thread or a weft thread of the fabric substrate of 5% or more when the resin composition is in the fully-cured state. In this case, warpage of the substrate material formed by use of the prepreg can be further decreased.

For measurement of the tensile elongation percentage, usually used is a specimen in which a resin composition of a single prepreg is into the fully-cured state (namely, C-stage state). Alternatively, used may be a specimen in which a plurality of prepregs are stacked so that directions of the warp thread and the weft thread of one of the prepregs are identical to those of another, respectively, and the resin compositions of the prepregs are in the fully-cured state. The measurement of the tensile elongation percentage may be conducted in the following tensile elongation test. First, a length ($L_0$) of a specimen in the oblique direction at 45 degrees to the warp thread or the weft thread is measured before the tensile elongation test. In this regard, the specimen is prepared to have a width of 5 mm in advance. Thereafter, the specimen is elongated in the oblique direction at 45 degrees to the warp thread or the weft thread at a velocity of 5 mm/min using a tensile elongation tester. A length (L) of the specimen at the moment of rupture is measured. The tensile elongation percentage may be calculated with the following equation.

Tensile elongation percentage (%)=$\{(L-L_0)/L_0\}*100$.

The CTE measured by the method in the following Examples is preferably not greater than 10 ppm/° C. In this case, it is possible to form the substrate material with further high connection reliability.

Particularly, it is more preferable that the prepreg in accordance with the present invention has the elastic modulus which is not more than 3.3 GPa and the tensile elongation percentage which is not less than 9.1%. In this case, the prepreg can be used as the substrate material in which warpage is more suppressed.

When the resin composition is in the similar fully-cured state to the state described above, a peak position of a loss tangent of the prepreg determined by dynamic mechanical analysis (DMA) is preferably at a temperature of 150° C. or more. The loss tangent is generally represented by a tan δ (tan δ is a quotient obtained by dividing a loss elastic modulus by a storage elastic modulus). Note that the loss tangent is measured by a commercially available dynamic mechanical analyzer. The temperature of the peak position of the loss tangent refers to a temperature at which the tan δ obtained by the dynamic mechanical analysis is highest (namely, a temperature at the peak top of the tan δ). When the peak position of the loss tangent is at 150° C. or more, it is possible to obtain a package excellent in thermal tolerance in which warpage is less likely to occur. The peak position of the loss tangent is more preferably at a temperature of 250° C. or more. The upper limit of the temperature of the peak position of the loss tangent is not particularly limited, but may be normally around 500° C.

The metal-clad laminate in accordance with the present invention is formed by disposing metal foil on the aforementioned prepreg. In this regard, the metal-clad laminate may be formed by disposing metal foil on one side or both sides of the single prepreg, or by stacking a plurality of prepregs to prepare a stack and disposing metal foil on one side or both sides of the stack. The metal foil may be cupper foil or the like. The aforementioned formation of the stack may be performed with a multistage vacuum press, a double belt, or the like by application of heat and press.

The printed wiring board in accordance with the present invention includes the metal-clad laminate formed to have a patterned conductor. The patterned conductor may be formed by, for example, a subtractive method or the like.

Thereafter, a semiconductor device is mounted on the aforementioned printed wiring board and enclosed. Consequently, a package such as FBGA (Fine pitch Ball Grid Array) may be prepared. Beside, this package may be used as a sub-package and these sub-packages may be stacked to prepare a package such as PoP (Package on Package).

As described above, by use of the printed wiring board, various forms of packages may be prepared. Besides, each of the packages is formed by use of the prepreg having both of the low elasticity characteristic and the high elongation characteristic, and thus warpage is less likely to occur. Accordingly, high quality packages can be obtained. These packages can be used in various applications such as communication equipment, measurement equipment, OA equipment, and peripheral terminal equipment thereof.

EXAMPLES

The present invention will be specifically described with Examples below.

Examples 1 to 8 and Comparative Examples 1 to 5

The A-component, the B-component, the C-component, and a curing accelerator ("2E4MZ" available from SHIKOKU CHEMICALS CORPORATION) were prepared, and compounded at compounding amounts (parts by mass) shown in Table 1. The resultant mixture was diluted by a solvent (methyl ethyl ketone) to provide a varnish of the resin composition. Note that the compounded materials in Table 1 are shown below.
(A-component)
(A-1) Naphthalene epoxy resin ("HP9500" available from DIC Corporation)
(A-2) Cresol novolac epoxy resin ("N673" available from DIC Corporation)
(A-3) Novolac-type phenolic curing agent ("TD2090" available from DIC Corporation)
(A-4) Naphthalene-type phenolic curing agent ("HPC9500" available from DIC Corporation)

The above-mentioned (A-1) and (A-2) correspond to the thermosetting resin, and (A-3) and (A-4) correspond to the curing agent. Therefore, (A-1) to (A-4) correspond to the "(A) thermosetting resin composition" (A-component) used in the present invention.
(B-component)
(B-1) Epoxy-modified acrylic resin ("SG-P3-Mw1" available from Nagase ChemteX Corporation, Mw: 260,000, Tg: 12° C.)
(B-2) Epoxy-modified acrylic resin ("SG-P3LC improve 24" available from Nagase ChemteX Corporation, Mw: 650,000, Tg: 30° C.)
(B-3) Epoxy-modified acrylic resin ("SG-P3" available from Nagase ChemteX Corporation, Mw: 850,000, Tg: 12° C.)
(B-4) Siloxane-modified phenolic resin ("GPI-LM" available from Gunei Chemical Industry Co., Ltd., Mw: 4,7000, Tg: 55° C.)
(B-5) Core-shell particles ("AC3816N" available from Ganz Chemical Co., Ltd.)

(B-1) is a resin having repeating units represented by the formulae (I) and (II) in which R1 represents a hydrogen atom, and R2 represents a butyl group and an ethyl group. (B-2) is a resin having repeating units represented by the formulae (I) and (II) in which R1 represents a hydrogen atom and a methyl group, and R2 represents a methyl group, a butyl group, and an ethyl group. (B-3) is a resin having repeating units represented by the formulae (I) and (II) in which R1 represents a hydrogen atom, and R2 represents a butyl group and an ethyl group. (B-4) is a resin having a siloxane group and a phenolic hydroxyl group. (B-1) to (B-4) correspond to the "(B) resin having the Tg of 100° C. or less (B-component)". In contrast, (B-5) is a starting material for Comparison, and is a core-shell particle in which a shell-phase is made of poly(methyl methacrylate) and a core-phase is made of cross-linked acrylic polymer.
(C-component)
(C-1) Spherical silica ("C2/KBM3103-treatment" available from Admatechs Company Limited) which has been subjected to surface-treatment with decyltrimethoxysilane ("KBM3103" available from Shin-Etsu Chemical Co., Ltd., referred to as "DTMS" in Table 1)

(C-2) Spherical silica ("C2/KBM3063-treatment" available from Admatechs Company Limited) which has been subjected to surface-treatment with hexyltrimethoxysilane ("KBM3063" available from Shin-Etsu Chemical Co., Ltd., referred to as "HTMS" in Table 1)

(C-3) Spherical silica ("SC2500-SEJ" available from Admatechs Company Limited) which has been subjected to surface-treatment with y-glycidoxypropyltrimethoxysilane ("KBM403" available from Shin-Etsu Chemical Co., Ltd., referred to as "GTMS" in Table 1)

(C-4) Spherical silica ("SO25R" available from Admatechs Company Limited) which has not been subjected to surface-treatment (C-1) and (C-2) correspond to the "C-component ((C) inorganic filler)". In contrast, (C-3) and (C-4) were used for an inorganic filler for comparison.

The prepreg was formed by impregnating the fabric substrate with the varnish of the resin composition prepared according to the compound composition shown in Table 1 so that the resultant prepreg had the thickness of 30 μm after the resin composition was fully cured, and drying by application of heat at 130° C. for 6 min until the resin composition was in the semi-cured state. The fabric substrate was a glass cloth ("1037" available from Asahi Kasei E-materials Corporation, thickness: 27 μm).

Regarding Examples and Comparative Examples obtained in the above-mentioned manner, various physical properties (a Tg, an elastic modulus, a CTE, and a tensile elongation percentage) were evaluated. Table 1 shows the results.

Note that evaluations of the various physical properties were conducted by the following methods.

(Measurement of Glass Transition Temperature (Tg))

To provide measurement samples, prepregs obtained by Examples and Comparative Examples were further subjected to a hot pressing process so that the resin compositions thereof were fully cured. The glass transition temperature of each measurement sample was measured by DMA, and a maximum value of the quotient of the loss elastic modulus to the storage elastic modulus regarding each measurement sample was adopted as the glass transition temperature (Tg). The measurement was conducted with a dynamic mechanical spectrometer "DMS6100" available from SII NanoTechnology Inc. under a condition of a rate of a temperature increase of 5° C./min.

(Elastic Modulus)

A sample for evaluation of the elastic modulus was obtained by stacking eight prepregs obtained by each of Examples and Comparative Examples, and molding the resultant stack. The elastic modulus (at 25° C.) of the sample was measured by DMA. The measurement was conducted with the dynamic mechanical spectrometer "DMS6100" available from SII NanoTechnology Inc.

(Coefficient of Thermal Expansion)

Regarding one sheet of the prepreg obtained in each of Examples and Comparative Examples, the coefficient of thermal expansion in a plate-thickness direction at a temperature was measured by TMA (thermo-mechanical analysis) according to JIS C 6481, the temperature being less than the glass transition temperature of the resin cured product in an insulating layer. The measurement was conducted with a TMA device ("TMA6000" available from SII NanoTechnology Inc.).

(Tensile Elongation Percentage)

To prepare a specimen, one sheet of the prepreg was subjected to treatment to fully cure the resin composition. The measurement of the tensile elongation percentage was performed in the following tensile elongation test. First, a length ($L_0$) of the specimen in the oblique direction at 45 degrees to the warp thread or the weft thread was measured before the tensile elongation test. In this regard, the specimen was prepared to be 5 mm in width. Thereafter, the specimen was elongated in the oblique direction at 45 degrees to the warp thread or the weft thread at a velocity of 5 mm/min using a tensile elongation tester ("Autograph AGS-X" available from Shimadzu corporation). A length (L) of the specimen at the moment of rupture was measured. The tensile elongation percentage was calculated with the above-mentioned equation: tensile elongation percentage (%)={(L−L0)/L0}*100.

TABLE 1

| Compounded materials and evaluation items | | 1 | 2 | 3 | 4 | 5 | 6 | 7 | 8 | 1 | 2 | 3 | 4 | 5 |
|---|---|---|---|---|---|---|---|---|---|---|---|---|---|---|
| | | Examples | | | | | | | | Comparative Examples | | | | |
| A-component | (A-1) Naphthalene epoxy resin | 48.06 | 48.06 | 48.06 | 48.06 | 48.06 | 38.59 | 0 | 41.82 | 48.06 | 48.06 | 48.06 | 68.66 | 48.06 |
| | (A-2) Cresol novolac epoxy resin | 0 | 0 | 0 | 0 | 0 | 0 | 40.68 | 0 | 0 | 0 | 0 | 0 | 0 |
| | (A-3) Novolac type phenolic curing agent | 21.94 | 21.94 | 21.94 | 21.94 | 21.94 | 15.35 | 0 | 0 | 21.94 | 21.94 | 21.94 | 31.34 | 21.94 |
| | (A-4) Naphthalene type phenolic curing agent | 0 | 0 | 0 | 0 | 0 | 0 | 29.32 | 28.18 | 0 | 0 | 0 | 0 | 0 |
| B-component | (B-1) Epoxy-modified acrylic resin (Mw: 260,000) | 30 | 30 | 30 | 0 | 0 | 0 | 30 | 30 | 30 | 30 | 30 | 0 | 0 |

TABLE 1-continued

| Compounded materials and evaluation items | | | Examples | | | | | | | | Comparative Examples | | | | |
|---|---|---|---|---|---|---|---|---|---|---|---|---|---|---|---|
| | | | 1 | 2 | 3 | 4 | 5 | 6 | 7 | 8 | 1 | 2 | 3 | 4 | 5 |
| | | (B-2) Epoxy-modified acrylic resin (Mw: 650,000) | 0 | 0 | 0 | 30 | 0 | 0 | 0 | 0 | 0 | 0 | 0 | 0 | 0 |
| | | (B-3) Epoxy-modified acrylic resin (Mw: 850,000) | 0 | 0 | 0 | 0 | 30 | 0 | 0 | 0 | 0 | 0 | 0 | 0 | 0 |
| | | (B-4) Siloxane-modified phenolic resin | 0 | 0 | 0 | 0 | 0 | 46.06 | 0 | 0 | 0 | 0 | 0 | 0 | 0 |
| | | (B-5) Core-shell type particles | 0 | 0 | 0 | 0 | 0 | 0 | 0 | 0 | 0 | 0 | 0 | 0 | 30 |
| | Curing accelerator (Imidazole) | | 0.05 | 0.05 | 0.05 | 0.05 | 0.05 | 0.05 | 0.05 | 0.05 | 0.05 | 0.05 | 0.05 | 0.05 | 0.05 |
| C-component | (C-1) DTMS surface-treated silica | | 200 | 0 | 0 | 200 | 200 | 0 | 0 | 0 | 0 | 0 | 0 | 0 | 0 |
| | (C-2) HTMS surface-treated silica | | 0 | 200 | 100 | 0 | 0 | 200 | 200 | 200 | 0 | 0 | 0 | 0 | 200 |
| | (C-3) GTMS surface-treated silica | | 0 | 0 | 0 | 0 | 0 | 0 | 0 | 0 | 0 | 200 | 0 | 0 | 0 |
| | (C-4) Surface-untreated silica | | 0 | 0 | 0 | 0 | 0 | 0 | 0 | 0 | 200 | 0 | 0 | 200 | 0 |
| Total (parts by mass) of the A-component, the B-component, and the C-component | | | 300.05 | 300.05 | 200.05 | 300.05 | 300.05 | 300.05 | 300.05 | 300.05 | 300.05 | 300.05 | 100.05 | 300.05 | 300.05 |
| Physical properties evaluation | Tg (° C.) | | 262 | 263 | 265 | 266 | 264 | 260 | 229 | 271 | 259 | 265 | 266 | 261 | 260 |
| | Elastic modulus (GPa) | | 3.2 | 2.8 | 3.0 | 3.0 | 3.3 | 2.4 | 2.6 | 2.8 | 6.5 | 6.8 | 3.4 | 8.5 | 6.4 |
| | CTE (ppm/° C.) | | 6.8 | 6.9 | 7.9 | 7.3 | 7.1 | 6.8 | 7.0 | 6.7 | 6.8 | 7.0 | 10.1 | 9.9 | 10.5 |
| | Tensile elongation percentage (%) | | 11.1 | 11.3 | 11.6 | 10.1 | 9.8 | 9.1 | 10.5 | 10.8 | 4.8 | 4.7 | 9.9 | 1.9 | 1.5 |

Each prepreg obtained in Examples 1 to 8 is low in elastic modulus and CTE yet has a high tensile elongation percentage, and therefore is apparently excellent in elongation characteristics. Accordingly, in each of these prepregs, warpage is less likely to occur. Hence, these prepregs can be used as a substrate material with high connection reliability.

In contrast, prepregs in Comparative Examples 1 and 2 contain inorganic filler other than the inorganic filler having been subjected to the treatment using the silane coupling agent represented by the general formula (1). Therefore, these prepregs are low in CTE but high in elastic modulus, and thus are not good in elongation characteristics. Besides, the prepreg in Comparative Example 3 does not contain any inorganic filler, and therefore is low in elastic modulus but high in CTE. Besides, the prepreg in Comparative Example 4 contains neither the B-component nor the C-component, and therefore is high in elastic modulus and CTE, and has decreased elongation characteristics. The prepreg in Comparative Example 5 contains core-shell particles rather than the B-component resin used in the present invention, and therefore is high both in elastic modulus and CTE, and has decreased elongation characteristics.

As described above, the prepregs obtained in Examples are sufficient in the above-mentioned characteristics, and are substrate materials having higher connection reliability than the prepregs in Comparative Examples. Consequently, the prepregs obtained in Examples are materials to form a package with high quality.

The invention claimed is:

1. A prepreg formed from a resin composition and a fabric substrate impregnated with the resin composition,
the resin composition comprising:
(A) a thermosetting resin composition;
(B) a resin having a Tg not more than 100° C.; and
(C) an inorganic filler, the resin (B) having the Tg not more than 100° C. having:
  a carbonyl group or a siloxane group; and
  an epoxy group or a phenolic hydroxyl group,
the inorganic filler (C) being subjected to surface-treatment with a silane coupling agent represented by a following general formula (1):

$$YSiX_3 \tag{1},$$

in the formula (1), X representing a methoxy group or an ethoxy group, and Y representing an aliphatic alkyl group having 6 to 18 carbon atoms.

2. The prepreg according to claim 1, wherein
the resin (B) having the Tg not more than 100° C. has a weight average molecular weight falling within a range of 10,000 to 1,000,000.

3. The prepreg according to claim 1, wherein
the resin (B) having the Tg not more than 100° C. has repeating units represented by following formulae (I) and (II), respectively in molecule, and an epoxy group;

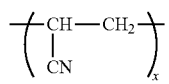  (I)

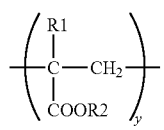  (II)

in the formulae (I) and (II), R1 represents H or $CH_3$, and R2 represents H or an alkyl group, and a ratio of x:y is 0:1 to 0.35:0.65.

4. The prepreg according to claim 1, wherein
the resin (B) having the Tg not more than 100° C. has a siloxane group and a phenolic hydroxyl group.

5. The prepreg according to claim 1, wherein
a tensile elongation percentage of the fabric substrate in an oblique direction at 45 degrees is 5% or more when the resin composition with which the fabric substrate is impregnated is in a fully-cured state.

6. The prepreg according to claim 1, wherein
a peak position of a loss tangent determined by dynamic mechanical analysis is at a temperature of 150° C. or more, when the resin composition with which the fabric substrate is impregnated is in a fully-cured state.

7. A metal-clad laminate, comprising:

the prepreg according to claim 1; and metal foil on the prepreg.

8. A printed wiring board, comprising the metal-clad laminate according to claim 7 being formed to have a patterned conductor.

* * * * *